(12) United States Patent
Kim et al.

(10) Patent No.: US 7,960,231 B2
(45) Date of Patent: Jun. 14, 2011

(54) METHOD OF FORMING A SEMICONDUCTOR MEMORY DEVICE

(75) Inventors: Jung Geun Kim, Seoul (KR); Seong Hwan Myung, Suwon-si (KR); Eun Soo Kim, Icheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 232 days.

(21) Appl. No.: 12/163,956

(22) Filed: Jun. 27, 2008

(65) Prior Publication Data

US 2009/0098722 A1 Apr. 16, 2009

(30) Foreign Application Priority Data

Oct. 10, 2007 (KR) .......... 10-2007-0102163

(51) Int. Cl.
*H01L 21/336* (2006.01)
(52) U.S. Cl. ........ 438/263; 438/264; 438/683; 438/684; 257/E21.006; 257/E21.17; 257/E21.016; 257/E21.077; 257/E21.645; 257/E21.324; 257/E21.422
(58) Field of Classification Search .......... 438/263, 438/264, 238, 381, 679, 680, 683, 684, 753; 257/E21.17, E21.006, E21.422, E21.645, E21.016, E21.077, E21.324

See application file for complete search history.

(56) References Cited

U.S. PATENT DOCUMENTS

| | | | |
|---|---|---|---|
| 7,045,419 B2 | 5/2006 | Luoh et al. | |
| 2002/0145162 A1* | 10/2002 | Kamada et al. | 257/316 |
| 2003/0003772 A1* | 1/2003 | Hibi et al. | 438/787 |
| 2008/0008908 A1* | 1/2008 | Ishiwata et al. | 428/811 |
| 2008/0106942 A1* | 5/2008 | Kim et al. | 365/185.17 |
| 2008/0211039 A1* | 9/2008 | Wang et al. | 257/412 |

FOREIGN PATENT DOCUMENTS

| | | |
|---|---|---|
| JP | 01-307275 | 12/1989 |
| KR | 1020060054823 A | 5/2006 |
| KR | 1020060122139 A | 11/2006 |

* cited by examiner

*Primary Examiner* — David Nhu
(74) *Attorney, Agent, or Firm* — Kilpatrick Townsend & Stockton LLP

(57) ABSTRACT

A method of forming a semiconductor memory device includes forming a tunnel insulating layer on a semiconductor substrate, and forming a silicon layer, including metal material, on the tunnel insulating layer. Accordingly, an increase in the strain energy of the conductive layer may be prohibited and, therefore, the growth of grains constituting the conductive layer may be prevented. Furthermore, a threshold voltage distribution characteristic and electrical properties of a semiconductor memory device may be improved.

13 Claims, 3 Drawing Sheets

METHOD OF FORMING A SEMICONDUCTOR MEMORY DEVICE

CROSS-REFERENCE TO RELATED APPLICATION

The present application claims priority to Korean patent application number 10-2007-0102163, filed on Oct. 10, 2007, which is incorporated by reference in its entirety.

BACKGROUND OF THE INVENTION

The present invention relates to a method of forming a semiconductor memory device and, more particularly, to a method of forming a semiconductor memory device which can improve threshold voltage distributions of the semiconductor memory device.

Semiconductor memory devices can be classified based on construction, material and driving method. Flash memory devices have become increasing popular due to ease of operation and large memory capacity.

A flash memory device generally has a structure in which a tunnel insulating layer, a floating gate, a dielectric layer and a control gate are sequentially stacked over a semiconductor substrate. The floating gate is used as a charge trap layer. The floating gate is described in detail below.

The floating gate is formed of a conductive layer, preferably, polysilicon. Semiconductor memory devices of 40 nm or less generally use a p-type doped polysilicon layer. The polysilicon layer can be formed by a chemical vapor deposition (CVD) method. Specifically, the polysilicon layer can be formed by a thermal CVD method using $SiH_4$ and $PH_3$ gas. After the polysilicon layer is formed, a thermal treatment process for lowering the resistance of the polysilicon layer is carried out.

The thermal treatment process lowers the resistance of the polysilicon layer, but increases the size of a grain. In particular, with the high integration of semiconductor memory devices, strain in the grain size can change distributions of a subsequent threshold voltage. Consequently, the electrical properties of the semiconductor memory device may be degraded.

BRIEF SUMMARY OF THE INVENTION

The present invention prohibits an increase in the grain size of a polysilicon layer by performing a thermal treatment process under controlled conditions after a polysilicon layer is formed over a semiconductor substrate.

The present invention prohibits an increase in the grain size by adding a high melting-point material when forming a conductive layer.

A method of forming a semiconductor memory device according to an aspect of the present invention includes forming a tunnel insulating layer on a semiconductor substrate, and forming a silicon layer, including metal material, on the tunnel insulating layer.

The silicon layer may include a polysilicon layer. The metal material may include high-melting point hetero-metal.

The high-melting point hetero-metal may be formed by a physical vapor deposition (PVD) method or a chemical vapor deposition (CVD) method. The high-melting point hetero-metal may comprise tungsten (W), molybdenum (Mo), tantalum (Ta), titanium (Ti), or a combination thereof.

After the silicon layer is formed, a thermal treatment process may be performed. The thermal treatment process may be performed using a furnace. The thermal treatment process may be performed in a temperature range of 400 to 500 degrees Celsius.

A method of forming a semiconductor memory device according to another aspect of the present invention includes forming a tunnel insulating layer and a conductive layer over a semiconductor substrate, and performing a thermal treatment process for lowering grain growth energy of the conductive layer, wherein the thermal treatment process may comprise performing a rapid thermal process.

The conductive layer may include a polysilicon layer. The rapid thermal process may be performed using a rapid temperature process (RTP), or a laser, flash or spike method. The rapid thermal process may be performed in a temperature range of 500 to 1000 degrees Celsius for 30 to 60 seconds.

A method of forming a semiconductor memory device according to still another aspect of the present invention includes forming a tunnel insulating layer on a semiconductor substrate, forming a conductive layer, including high-melting point hetero-metal, on the tunnel insulating layer, and performing a thermal treatment process for prohibiting an increase in a grain size of the conductive layer.

The conductive layer may include a mixture of the high-melting point hetero-metal and a polysilicon layer, or a single layer of the polysilicon layer. The thermal treatment process may be performed using a furnace or a rapid thermal process.

DESCRIPTION OF SPECIFIC EMBODIMENTS

Figure 1:
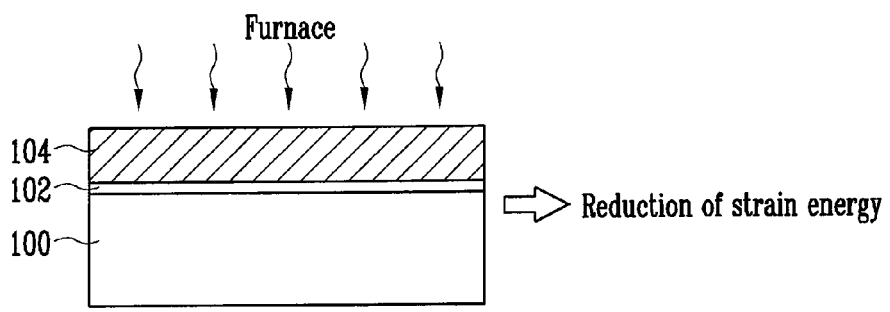
FIG. 1 is a view illustrating a method of forming a semiconductor memory device in accordance with an embodiment of the present invention.

A flash memory device uses a conductive layer as a floating gate. In the flash memory device, the floating gate is used as a charge trap layer. A change in the physical properties of the floating gate has a great influence on the reliability of devices. A polysilicon layer is generally used as the conductive layer for the floating gate. In particular, after the conductive layer is formed, a thermal treatment process is performed in order to lower the resistance of the conductive layer. This is described in more detail below.

If the thermal treatment process is performed, the conductive layer undergoes a recovery step, a re-crystallization step, a primary grain growth step and a secondary grain growth step. In the re-crystallization step, grains of the conductive layer are recrystallized. As the temperature of the thermal treatment process rises, the grains of the conductive layer can be activated, thereby accelerating the growth of the grains. During the re-crystallization step, a minimum temperature (Tmin) is generally higher than half a melting point (also called fusing point, Tm) of material. This relationship may be expressed as Tmin>1/2×Tm.

In the primary and secondary grain growth steps, atoms are migrated. An energy source necessary for such atom migration can include strain energy other than thermal energy. This is described in more detail below.

Total strain energy E4 of material can be deformed by elastic energy E1, grain boundary energy E2 and other factors E3. The total strain energy E4 is generally influenced by the elastic energy E1 and the grain boundary energy E2. In order to reduce the total strain energy E4 of material, it is preferred that the elastic energy E1 and the grain boundary energy E2 be reduced. Equation 1 represents the elastic energy E1 and Equation 2 represents the grain boundary energy E2.

$$E1 = (1/\nu)/2 Y \times \sigma^2 \quad \text{[Equation 1]}$$

$$E2 = A \times Egb \quad \text{[Equation 2]}$$

In Equations 1 and 2, the respective variables are pertinent to the physical properties of a conductive layer (for example, a polysilicon layer). Specifically, v denotes Poission's ratio, Y denotes an elastic coefficient, σ denotes residual stress, A denotes an area, and Egb denotes the grain boundary energy.

As described above, if both or any one of the elastic energy E1 and the grain boundary energy E2 of the conductive layer is reduced, the total strain energy E4 of the conductive layer can be reduced and an increase in the grain size can be prohibited.

Specific embodiments according to the present invention will be described with reference to the accompanying drawings. However, the present invention is not limited to the disclosed embodiments, but may be implemented in various ways. The embodiments are provided to complete the disclosure of the present invention and to allow those having ordinary skill in the art to understand the scope of the present invention. The present invention is defined by the category of the claims.

FIG. 1 is a view illustrating a method of forming a semiconductor memory device in accordance with an embodiment of the present invention. This method may be used to reduce the strain energy. In particular, this method may be used to reduce the strain energy of a conductive layer 104 in a semiconductor substrate 100 over which the conductive layer 104 is formed.

For example, a method of fabricating a flash memory device is described below. A tunnel insulating layer 102 and the conductive layer 104 for a floating gate are sequentially stacked over the semiconductor substrate 100. The tunnel insulating layer 102 may be formed of an oxide layer. The conductive layer 104 may be preferably formed of a polysilicon layer. To prohibit grain strain of the polysilicon layer, a thermal treatment process is carried out. The thermal treatment process may be performed using a furnace or a rapid thermal process (RTP). When the furnace is used, a low-temperature thermal treatment process is preferably performed at a temperature lower than that of the prior art. For example, the low-temperature thermal treatment process may be performed in a temperature range of 400 to 500 degrees Celsius. This is described below with reference to FIG. 4.

Figure 4:
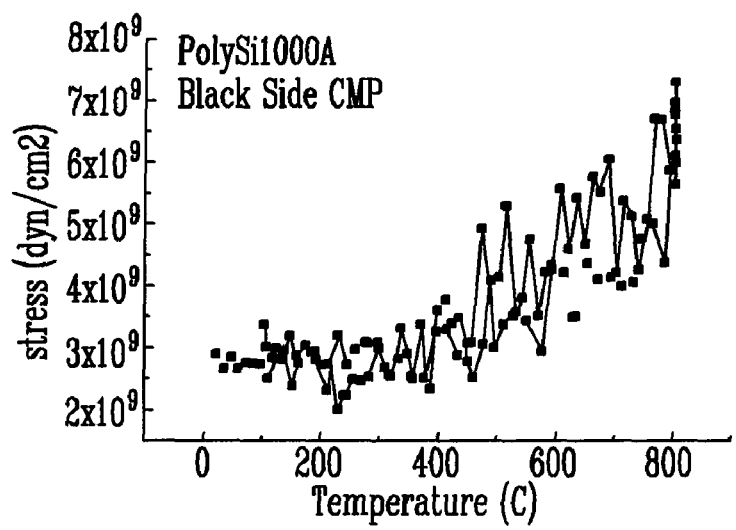
FIG. 4 is a graph showing a change of tension stress with respect to a thermal treatment temperature.

FIG. 4 is a graph showing a change of tension stress with respect to a thermal treatment temperature. In the case of a polysilicon layer, tension stress increases as the temperature of the thermal treatment rises. For example, the polysilicon layer before the thermal treatment process is performed may have tension stress of $2.8 \times 10^9$ dyn/cm$^2$. In the prior art, after the polysilicon layer is formed, the thermal treatment process is performed at a high temperature (for example, 700 to 800 degrees Celsius), thereby significantly increasing tension stress of the polysilicon layer (for example, $7.0 \times 10^9$ dyn/cm$^2$). However, if the thermal treatment process is performed in a temperature range of 400 to 500 degrees Celsius as in the present invention, the tension stress of the polysilicon layer may be lowered. Accordingly, strain energy of the polysilicon layer may be decreased and grain growth may be prohibited.

Figure 2:
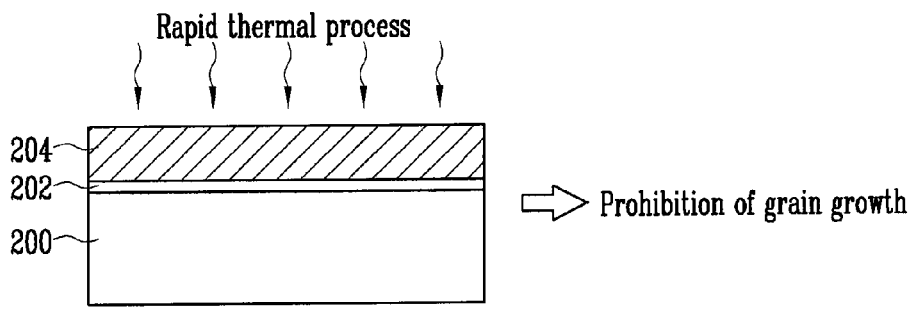
FIG. 2 is a view illustrating a method of forming a semiconductor memory device in accordance with another embodiment of the present invention.

FIG. 2 is a view illustrating a method of forming a semiconductor memory device in accordance with another embodiment of the present invention.

Specifically, a tunnel insulating layer 202 and a conductive layer 204 for a floating gate are sequentially formed over a semiconductor substrate 200. The conductive layer 204 may be formed of a polysilicon layer. To prohibit grain growth of the polysilicon layer, a rapid thermal process may be carried out. The rapid thermal process may be performed using a rapid temperature process (RTP), or a laser, flash or spike method without using a furnace. The rapid thermal process may be preferably carried out in a temperature range of 500 to 1000 degrees Celsius for 30 to 60 seconds. If the rapid thermal process is performed within a short time frame as described above, the time necessary for the grain growth of the polysilicon layer may be shortened. Thus, grain growth of the polysilicon layer may be prohibited.

Figure 3:
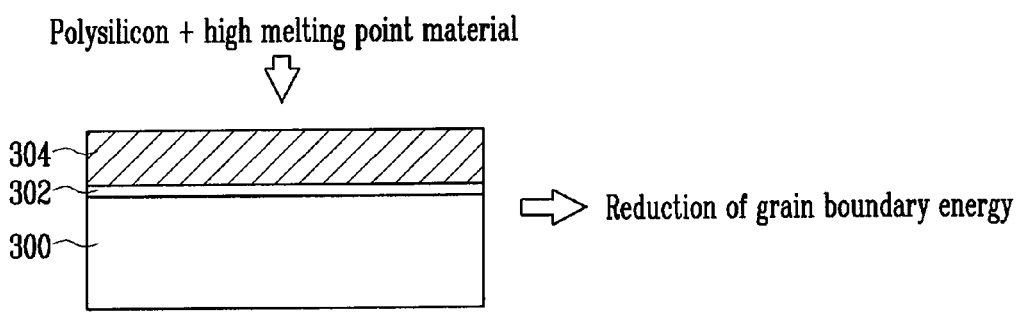
FIG. 3 is a view illustrating a method of forming a semiconductor memory device in accordance with still another embodiment of the present invention.

FIG. 3 is a view illustrating a method of forming a semiconductor memory device in accordance with still another embodiment of the present invention.

Specifically, a tunnel insulating layer 302 and a conductive layer 304 for a floating gate are sequentially formed over a semiconductor substrate 300. The conductive layer 304 may be formed of a polysilicon layer in which a high-melting point hetero-metal is doped, wherein the polysilicon layer is formed by a physical vapor deposition (PVD) method or a chemical vapor deposition (CVD) method. A high-melting point hetero-metal is doped into the polysilicon layer in order to reduce the grain boundary energy of the conductive layer 304.

The high-melting point hetero-metal is metal having a very high melting point and may include, for example, tungsten (W) having a melting point of 3410 degrees Celsius, molybdenum (Mo) having a melting point of 2610 degrees Celsius, tantalum (Ta) having a melting point of 2996 degrees Celsius, titanium (Ti) having a melting point of 1675 degrees Celsius, or a combination thereof. The high-melting point hetero-metal is used because, in a subsequent thermal treatment process, an increase in the grain size of the conductive layer 304 for the floating gate may be prohibited and, therefore, an increase in the grain boundary may be prohibited.

Figure 5:
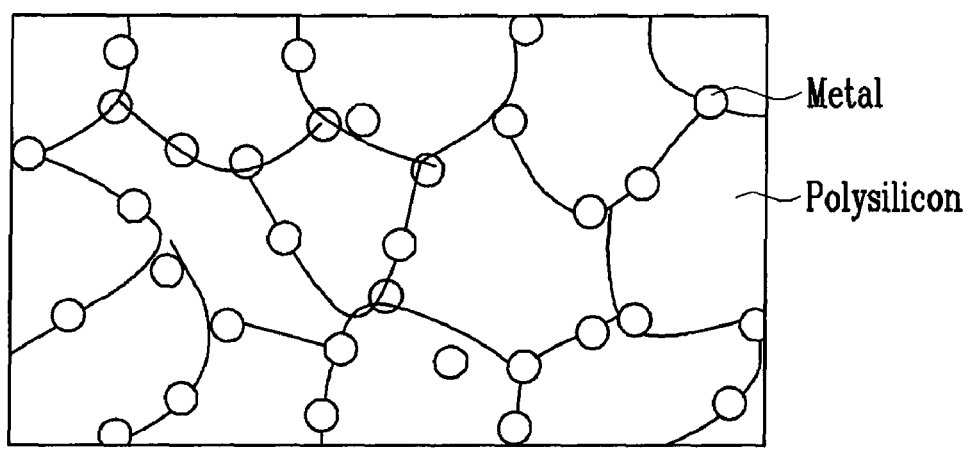
FIG. 5 is a view showing the structure of a conductive layer shown in FIG. 3.

FIG. 5 is a view showing the structure of the conductive layer shown in FIG. 3. This drawing shows that the conductive layer is formed by doping polysilicon and high-melting point hetero-metal.

If high-melting point hetero-metal is doped into the conductive layer 304 as described above, a phase change of the conductive layer 304 may be prohibited and the grain boundary energy may be decreased through impurity grain boundary segregation. Since an increase in the grain size of the conductive layer 304 may be prohibited, grain boundary mobility due to impurity grain boundary segregation may be decreased and the resistance of the conductive layer 304 may also be reduced due to the addition of metal. Accordingly, stress within the conductive layer 304 may be decreased and, therefore, grain growth may be prohibited. Consequently, grains having a size on the scale of nanometers may be formed and the electrical properties of a semiconductor memory device may be improved.

Although not shown in the drawings, a dielectric layer (not shown) and a conductive layer (not shown) for a control gate may be sequentially stacked over the conductive layer 304 through a subsequent process. A gate patterning process may then be performed, thereby completing formation of a semiconductor memory device.

Figure 6:
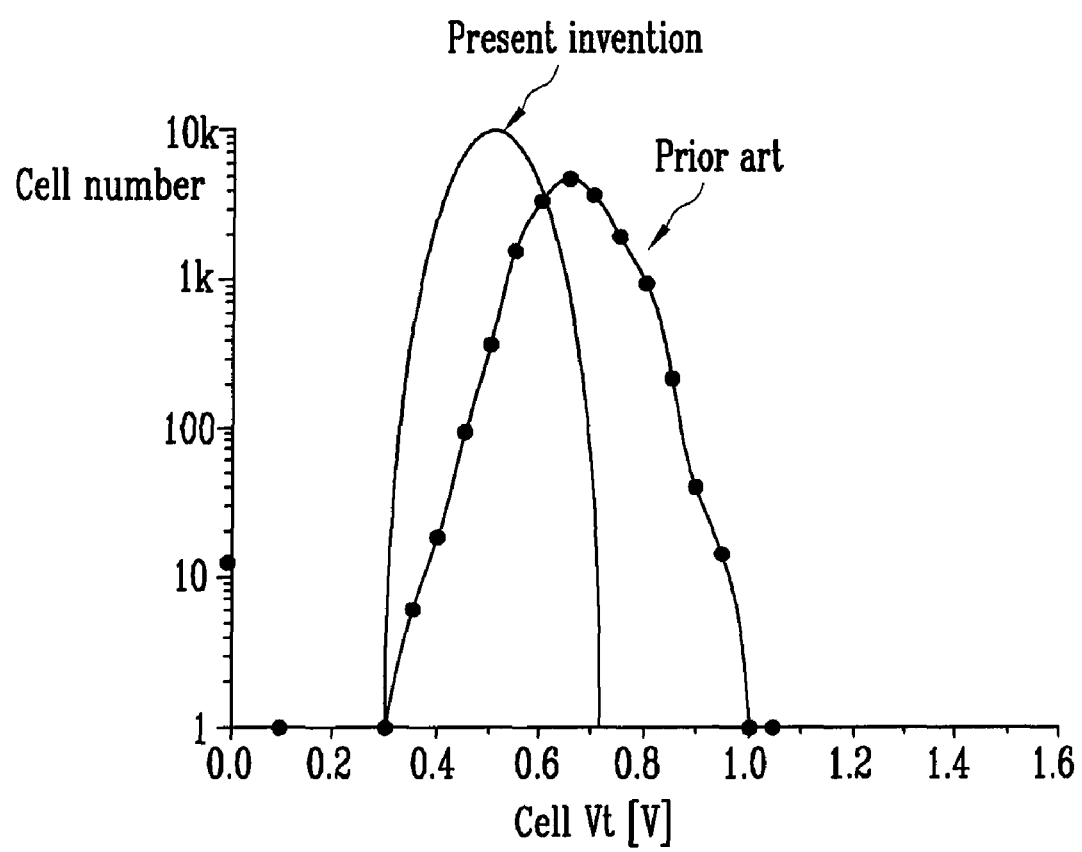
FIG. 6 is a graph showing a comparison between a change of threshold voltage distributions of a conventional semiconductor memory device and a change of threshold voltage distributions of the semiconductor memory device according to the present invention.

FIG. 6 is a graph showing a comparison between a change of threshold voltage distributions of a conventional semiconductor memory device and a change of threshold voltage distributions of the semiconductor memory device according to the present invention. As shown in FIG. 6, the threshold voltage distributions according to the present invention are narrower than the threshold voltage distributions according to the prior art. Accordingly, a semiconductor memory device formed by the method of the present invention exhibits improved electrical properties.

The three methods of forming a semiconductor device in accordance with embodiments of the present invention may be implemented independently or in combination. Thus, an increase in the grain growth energy of a semiconductor memory device may be prohibited and an increase in the grain size constituting a conductive layer may be prevented. Accordingly, a change in threshold voltage distributions of a semiconductor memory device may be prohibited and the electrical properties of the semiconductor memory device may be improved.

According to the present invention, after the tunnel insulating layer is formed on the semiconductor substrate, the conductive layer is formed on the tunnel insulating layer by controlling a condition for a thermal treatment process or adding high-melting point material. Thus, an increase in the strain energy of the conductive layer may be prohibited and, therefore, the growth of grains constituting the conductive layer may be prevented. Accordingly, a threshold voltage distribution characteristic and electrical properties of a semiconductor memory device may be improved.

The embodiments disclosed herein have been proposed to allow a person skilled in the art to easily implement the present invention, and the person skilled in the art may implement the present invention by a combination of these embodiments. Therefore, the scope of the present invention is not limited by or to the embodiments as described above, and should be construed to be defined only by the appended claims and their equivalents.

What is claimed is:

1. A method of forming a semiconductor memory device, the method comprising:
   forming a tunnel insulating layer over a semiconductor substrate;
   forming a first conductive layer over the tunnel insulating layer, wherein a high-melting point hetero-metal is doped into the first conductive layer; and
   forming a dielectric layer and a second conductive layer on the first conductive layer.

2. The method of claim 1, wherein the first conductive layer comprises a polysilicon layer in which the high-melting point hetero-metal is doped during the formation of the first conductive layer.

3. The method of claim 1, wherein the high-melting point hetero-metal comprises one of tungsten (W), molybdenum (Mo), tantalum (Ta), titanium (Ti), and a combination thereof 4. The method of claim 1, further comprising performing a thermal treatment process after the first conductive layer is formed.

5. The method of claim 4, wherein the thermal treatment process is performed using a furnace.

6. The method of claim 5, wherein the thermal treatment process is performed in a temperature range of 400 to 500 degrees Celsius.

7. A method of forming a semiconductor memory device, the method comprising:
   forming a tunnel insulating layer and a conductive layer over a semiconductor substrate; and
   performing a rapid thermal process for lowering a grain growth energy of the conductive layer, wherein the rapid thermal process is performed in a temperature range of 500 to 1000 degrees Celsius for 30 to 60 seconds.

8. The method of claim 7, wherein the conductive layer comprises a polysilicon layer.

9. The method of claim 7, wherein the rapid thermal process is performed using a rapid temperature process (RTP), a laser method, a flash method or a spike method.

10. A method of forming a semiconductor memory device, the method comprising:
    forming a tunnel insulating layer over a semiconductor substrate;
    forming a conductive layer over the tunnel insulating layer, wherein the conductive layer comprises a mixture of a high-melting point hetero-metal and a polysilicon layer; and
    performing a thermal treatment process for prohibiting an increase in a grain size of the conductive layer.

11. The method of claim 10, wherein the thermal treatment process is performed by a rapid thermal process in a temperature range of 500 to 1000 degrees Celsius for 30 to 60 seconds.

12. The method of claim 10, wherein the thermal treatment process is performed using a furnace or a rapid thermal process.

13. A method of forming a semiconductor memory device, the method comprising:
    forming a tunnel insulating layer over a semiconductor substrate; and
    forming a polysilicon layer on the tunnel insulating layer, wherein a high-melting point hetero-metal is doped into the polysilicon layer during the formation of the polysilicon layer.

* * * * *